(12) United States Patent
Zang et al.

(10) Patent No.: US 10,553,486 B1
(45) Date of Patent: Feb. 4, 2020

(54) FIELD EFFECT TRANSISTORS WITH SELF-ALIGNED METAL PLUGS AND METHODS

(71) Applicant: GLOBALFOUNDRIES INC., Grand Cayman (KY)

(72) Inventors: Hui Zang, Guilderland, NY (US); Ruilong Xie, Schenectady, NY (US); Laertis Economikos, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/047,037

(22) Filed: Jul. 27, 2018

(51) Int. Cl.
| | |
|---|---|
| *H01L 21/768* | (2006.01) |
| *H01L 29/66* | (2006.01) |
| *H01L 21/8234* | (2006.01) |
| *H01L 29/45* | (2006.01) |
| *H01L 21/321* | (2006.01) |

(52) U.S. Cl.
CPC .... *H01L 21/76897* (2013.01); *H01L 21/7684* (2013.01); *H01L 21/76802* (2013.01); *H01L 21/76877* (2013.01); *H01L 21/823437* (2013.01); *H01L 21/823468* (2013.01); *H01L 21/823475* (2013.01); *H01L 29/45* (2013.01); *H01L 29/66545* (2013.01); *H01L 21/3212* (2013.01); *H01L 21/823431* (2013.01)

(58) Field of Classification Search
CPC ......... H01L 21/76897; H01L 21/76802; H01L 21/7684; H01L 21/76877; H01L 21/823437; H01L 21/823468; H01L 21/823475; H01L 21/3212; H01L 21/823431; H01L 29/45; H01L 29/66545
See application file for complete search history.

(56) References Cited

U.S. PATENT DOCUMENTS

| | | | |
|---|---|---|---|
| 5,960,270 | A | 9/1999 | Misra et al. |
| 6,072,221 | A | 6/2000 | Hieda |
| 6,110,790 | A | 8/2000 | Chen |
| 6,172,411 | B1 | 1/2001 | Chao et al. |
| 6,235,593 | B1 | 5/2001 | Huang |
| 7,615,831 | B2 | 11/2009 | Zhu et al. |
| 8,436,404 | B2 | 5/2013 | Bohr et al. |
| 8,679,969 | B2 | 3/2014 | Urteaga et al. |
| 8,765,590 | B2 | 7/2014 | Cheng et al. |
| 8,766,360 | B2 | 7/2014 | Cheng et al. |
| 8,884,344 | B2 | 11/2014 | Cheng et al. |

(Continued)

*Primary Examiner* — Yosef Gebreyesus
(74) *Attorney, Agent, or Firm* — Gibb & Riley, LLC; Francois Pagette

(57) ABSTRACT

Disclosed is a method of forming an integrated circuit (IC) and the resulting structure. The method includes forming a transistor with a sacrificial gate on a channel region, a gate sidewall spacer on the sacrificial gate, and sacrificial plugs on the source/drain regions. The sacrificial gate is replaced with a gate, a gate cap on the gate, and a sacrificial cap on the gate cap and the gate sidewall spacer (which was recessed). Thus, top surfaces of the gate cap and gate sidewall spacer are at a lower level than the top surfaces of the sacrificial plugs and, when the sacrificial plugs are replaced with metal plugs, the gate cap is protected. In the resulting structure, the gate cap has a desired thickness and the top surface of the gate cap is at a lower level than the top surfaces of the metal plugs to reduce the risk of shorts.

19 Claims, 17 Drawing Sheets

(56) References Cited

U.S. PATENT DOCUMENTS

| | | | |
|---|---|---|---|
| 9,293,576 | B2 | 3/2016 | Cheng et al. |
| 9,941,162 | B1 | 4/2018 | Chanemougame et al. |
| 2007/0222073 | A1 | 9/2007 | Farooq et al. |
| 2010/0264550 | A1 | 10/2010 | Yang |
| 2012/0175711 | A1 | 7/2012 | Ramachandran et al. |
| 2013/0248950 | A1* | 9/2013 | Kang .................. H01L 29/78 257/288 |
| 2014/0264479 | A1* | 9/2014 | Cai .................. H01L 29/401 257/288 |
| 2015/0137273 | A1 | 5/2015 | Zhang et al. |
| 2016/0035743 | A1 | 2/2016 | Cheng et al. |
| 2017/0162437 | A1 | 6/2017 | Rubin et al. |
| 2017/0221891 | A1* | 8/2017 | Chen .................. H01L 27/0886 |
| 2018/0166335 | A1 | 6/2018 | Chanemougame et al. |

\* cited by examiner ated circuit (IC) US 10,553,486 B1

FIELD EFFECT TRANSISTORS WITH SELF-ALIGNED METAL PLUGS AND METHODS

FIELD OF THE INVENTION

The present invention relates to integrated circuit (IC) structures and, more particularly, to methods of forming IC structures with one or more field effect transistors (FETs) having self-aligned metal plugs.

BACKGROUND

In integrated circuit (IC) designs middle of the line (MOL) contacts electrically connect the nodes of field effect transistors (FETs) to back end of the line (BEOL) metal levels. Specifically, a FET (e.g., a fin-type field effect transistor (FINFET), a gate-all-around FET (GAAFET), a planar FET, etc.) can include at least one channel region positioned laterally between source/drain drain regions and a gate adjacent to the channel region(s). The MOL contacts for such a FET can include: a gate contact on the gate; metal plugs (TSs) on the source/drain regions, positioned laterally adjacent to the gate and isolated therefrom by gate sidewall spacers; and source/drain contacts (CAs) on the metal plugs. Recently techniques have been developed for forming self-aligned metal plugs. However, with device size scaling, these techniques can result in metal plug to gate shorts and/or source/drain contact to gate shorts.

SUMMARY

In view of the foregoing, disclosed herein are methods of forming an integrated circuit (IC) that include one or more field effect transistors (FET) with self-aligned metal plugs on the source/drain regions. In the methods, a novel technique is used to form the self-aligned metal plugs and results in a more robust IC structure. Specifically, in the methods, a FET is formed with a sacrificial gate for replacement metal gate processing on a channel region, a gate sidewall spacer on the sidewalls of the sacrificial gate, and sacrificial plugs for replacement metal plug processing on the source/drain regions and positioned laterally immediately adjacent to the gate sidewall spacer. When the sacrificial gate is removed, it is replaced with a gate, a gate cap having a desired thickness on top of the gate, and a sacrificial cap covering the top surfaces of the gate cap and the gate sidewall spacer (which has been recessed). As a result, the top surfaces of the gate cap and the gate sidewall spacer are lower than the top surfaces of the sacrificial plugs. During subsequent processing to replace the sacrificial plugs with metal plugs, the sacrificial cap protects the gate cap. In the resulting IC structure, the gate cap retains the desired thickness and the metal plugs have top surfaces that are above the level of the top surfaces of the gate cap. Thus, the risk of shorts occurring between the FET gate and either the metal plugs or subsequently formed source/drain contacts is minimized.

Generally, the methods form an integrated circuit (IC) that includes a field effect transistor (FET) with self-aligned metal plugs on the source/drain regions. In the methods, a sacrificial gate can be selectively removed to create a gate opening, which exposes a channel region. The channel region is positioned laterally between source/drain regions, sacrificial plugs are on the source/drain regions, and a gate sidewall spacer laterally surrounds the gate opening and physically separates the gate opening from the sacrificial plugs. A gate can be formed in a lower portion of the gate opening and a gate cap layer can be deposited into the gate opening and over the sacrificial plugs. The gate cap layer and the gate sidewall spacer can be then be recessed to form a gate cap with a desired thickness on the gate in a middle portion of the gate opening and to widen an upper portion of the gate opening. Next, a sacrificial cap can be formed in the upper portion of the gate opening on the top surfaces of the gate cap and the gate sidewall spacer. Following formation of the sacrificial cap, replacement metal plug processing can be performed. That is, the sacrificial plugs can be selectively removed to form metal plug openings, which expose the source/drain regions. Self-aligned metal plugs can then be formed in the metal plug openings such that the top surfaces of the metal plugs are above the level of the top surfaces of the gate cap and the gate sidewall spacer.

More specifically, a method embodiment can include selectively removing a sacrificial gate to create a gate opening that exposes a channel region. The channel region is positioned laterally between source/drain regions, sacrificial plugs are on the source/drain regions, and a gate sidewall spacer laterally surrounds the gate opening and physically separates the gate opening from the sacrificial plugs. A gate can be formed in a lower portion of the gate opening and gate cap layer can be deposited into the gate opening and over the sacrificial plugs. The gate cap layer and the gate sidewall spacer (which can, for example, be made of the same first dielectric material) can be simultaneously and selectively recessed to form a gate cap with a desired thickness on the gate in a middle portion of the gate opening and to widen an upper portion of the gate opening. Recessing the gate cap layer and gate sidewall spacer will also expose the top surfaces of the sacrificial plugs (which are formed of a second dielectric material that is different from the first dielectric material).

The upper portion of the gate opening can then be filled with a sacrificial cap. This sacrificial cap can be formed of a sacrificial material that is different from the first dielectric material of the gate cap layer and the gate sidewall spacer, different from the second dielectric material of the sacrificial plugs, and also different from the metal material that will subsequently be used during replacement metal plug processing. For example, sacrificial material can be tungsten, polysilicon, or a third dielectric material, such as a high-K dielectric material. To form the sacrificial cap, the sacrificial material can be deposited over the partially completed structure and a polishing process can be performed to expose the top surfaces of the sacrificial plugs, thereby forming the sacrificial cap in the upper portion of the gate opening (i.e., on the top surfaces of the gate cap and the gate sidewall spacer) and ensuring that the top surface of the sacrificial cap is essentially co-planar with the top surfaces of the adjacent sacrificial plugs.

Following formation of the sacrificial cap, replacement metal plug processing can be performed. That is, the sacrificial plugs can be selectively removed to form metal plug openings, which expose the source/drain regions. Self-aligned metal plugs (e.g., self-aligned cobalt plugs) can then be formed in the metal plug openings. Given the use of the sacrificial cap, the metal plugs can be formed without further reducing the thickness of the gate cap and such that the top surfaces of the metal plugs are above the level of the top surfaces of the gate cap and the gate sidewall spacer. To complete the IC structure, the sacrificial cap can be selectively removed, an interlayer dielectric (ILD) layer can be deposited, and source/drain contacts can be formed through the ILD layer to the metal plugs such that the bottom surfaces of the source/drain contacts are above the level of the top surfaces of the gate cap and gate sidewall spacer.

Also disclosed herein are integrated circuits (ICs) that are formed, according to the above-described methods, so as to include a field effect transistor (FET) with self-aligned metal plugs on the source/drain regions.

Specifically, an IC structure embodiment can include at least one FET. The FET can include a semiconductor body with a channel region that is positioned laterally between source/drain regions. The FET can further include gate adjacent to the channel region, a gate cap on the top surface of the gate, and a gate sidewall spacer positioned laterally adjacent to the gate and, particularly, laterally surrounding the gate and the gate cap. The top surfaces of the gate cap and the gate sidewall spacer can be substantially co-planar.

The IC structure can further include metal plugs on the source/drain regions. The metal plugs can be "self-aligned" as discussed further in the detailed description section and can be positioned laterally immediately adjacent to the gate sidewall spacer on either side of the gate. Furthermore, the metal plugs can have upper ends that extend vertically above the gate cap and the gate sidewall spacer. Thus, the top surfaces of the metal plugs are above the level of the top surfaces of the gate cap and the gate sidewall spacer.

The IC structure can further include a blanket interlayer dielectric (ILD) layer over the gate cap, the gate sidewall spacer and the upper ends of the metal plugs. Source/drain contacts can extend essentially vertically through the ILD layer to the upper ends of metal plugs and the bottom surfaces of these source/drain contacts can be above the level of the top surfaces of the gate and the gate sidewall spacer.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, in integrated circuit (IC) designs middle of the line (MOL) contacts electrically connect the nodes of field effect transistors (FETs) to back end of the line (BEOL) metal levels. Specifically, a FET (e.g., a fin-type field effect transistor (FINFET), a gate-all-around FET (GAAFET), a planar FET, etc.) can include at least one channel region positioned laterally between source/drain drain regions and a gate adjacent to the channel region(s). The MOL contacts for such a FET can include: a gate contact on the gate; metal plugs (TSs) on the source/drain regions, positioned laterally adjacent to the gate and isolated therefrom by gate sidewall spacers; and source/drain contacts (CAs) on the metal plugs. Recently techniques have been developed for forming self-aligned metal plugs. However, with device size scaling, these techniques can result in metal plug to gate shorts and/or source/drain contact to gate shorts.

In view of the foregoing, disclosed herein are methods of forming an integrated circuits (ICs) that include one or more field effect transistors (FET) with self-aligned metal plugs on the source/drain regions. In the methods, a novel technique is used to form the self-aligned metal plugs and results in a more robust IC structure. Specifically, in the methods, a FET is formed with a sacrificial gate for replacement metal gate processing on a channel region, a gate sidewall spacer on the sidewalls of the sacrificial gate, and sacrificial plugs for replacement metal plug processing on the source/drain regions and positioned laterally immediately adjacent to the gate sidewall spacer. When the sacrificial gate is removed, it is replaced with a gate, a gate cap having a desired thickness on top of the gate, and a sacrificial cap covering the top surfaces of the gate cap and the gate sidewall spacer (which has been recessed). As a result, the top surfaces of the gate cap and the gate sidewall spacer are lower than the top surfaces of the sacrificial plugs. During subsequent processing to replace the sacrificial plugs with metal plugs, the sacrificial cap protects the gate cap. In the resulting IC structure, the gate cap retains the desired thickness and the metal plugs have top surfaces that are above the level of the top surfaces of the gate cap. Thus, the risk of shorts occurring between the FET gate and either the metal plugs or subsequently formed source/drain contacts is minimized.

Figure 1:
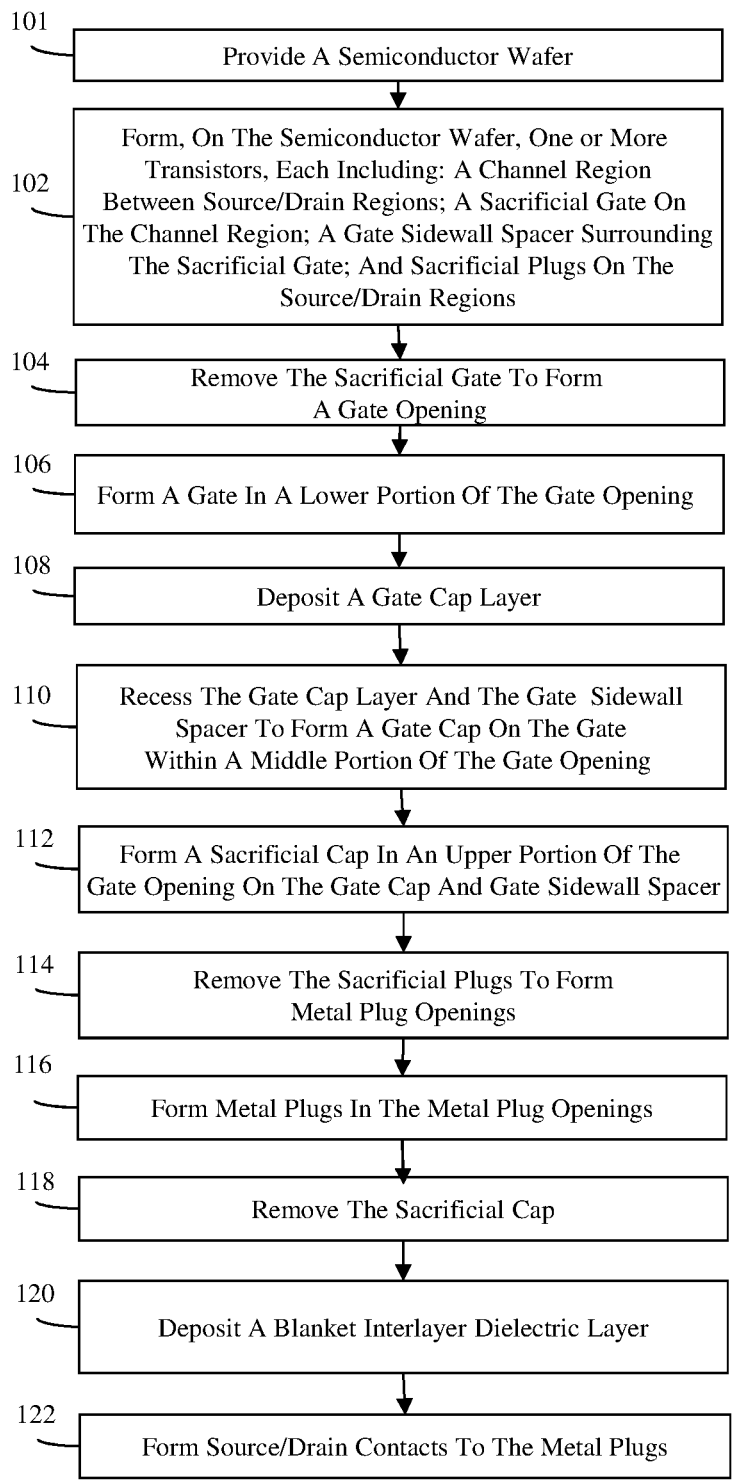
FIG. 1 is a flow diagram illustrating methods of forming an integrated circuit (IC) structure with self-aligned metal plugs.

More specifically, referring to the flow diagram of FIG. 1, disclosed herein are methods of forming an integrated circuit (IC) that includes one or more field effect transistors (FETs) with self-aligned metal plugs on the source/drain regions.

Figure 2:
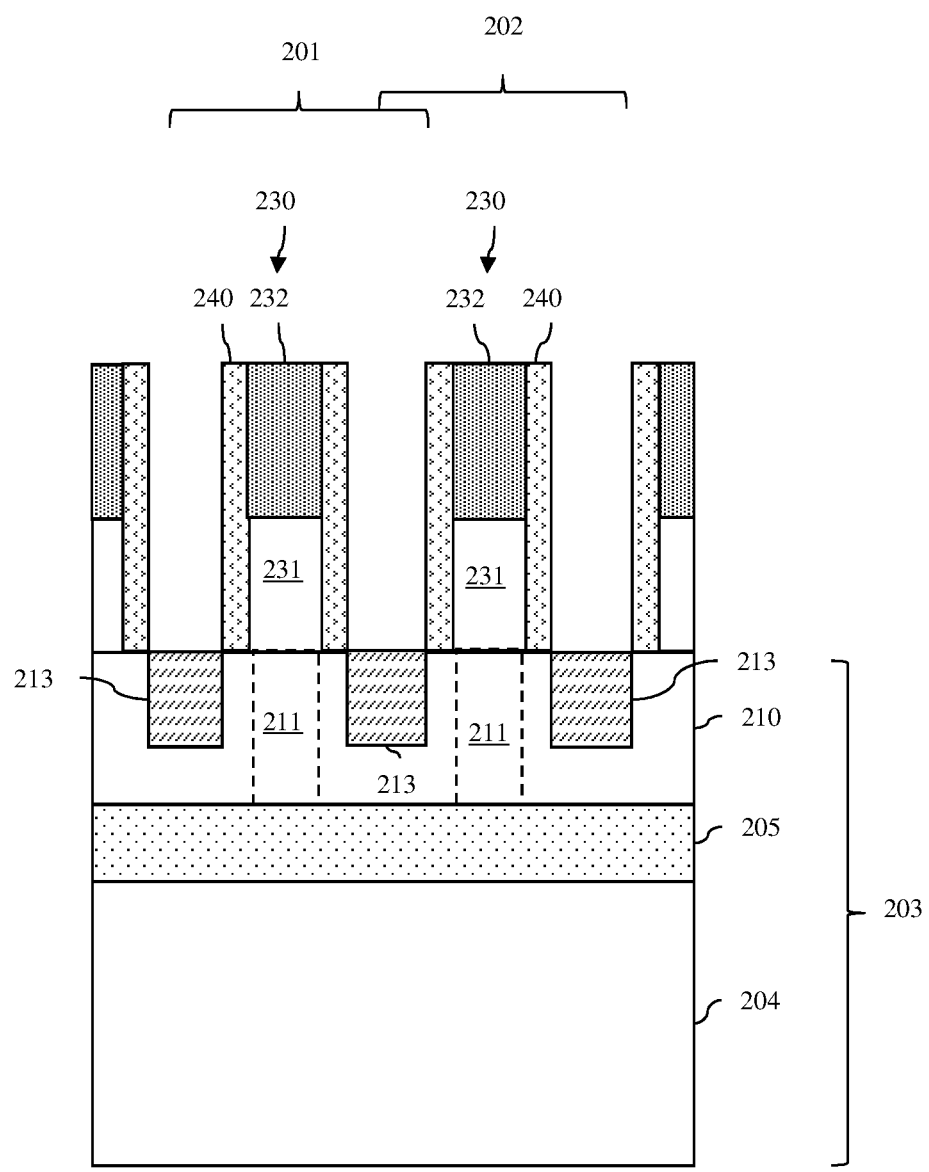
FIGS. 2-16 are cross-section diagrams of partially completed IC structures formed according to the flow diagram of FIG. 1.

The methods begin with a semiconductor wafer 203 (see process 101 and FIG. 2). The semiconductor wafer 203 can be, for example, a semiconductor-on-insulator wafer (e.g., a silicon-on-insulator (SOI) wafer) that includes a semiconductor substrate 204 (e.g., a silicon substrate), an insulator layer 205 (e.g., a buried oxide (BOX) layer or other suitable insulator layer on the semiconductor substrate) and a semiconductor layer (e.g., a silicon layer or other suitable semiconductor layer) on the insulator layer 205. Alternatively, the semiconductor wafer can be a bulk semiconductor wafer (e.g., a bulk silicon wafer or other suitable bulk semiconductor wafer).

Figure 3:
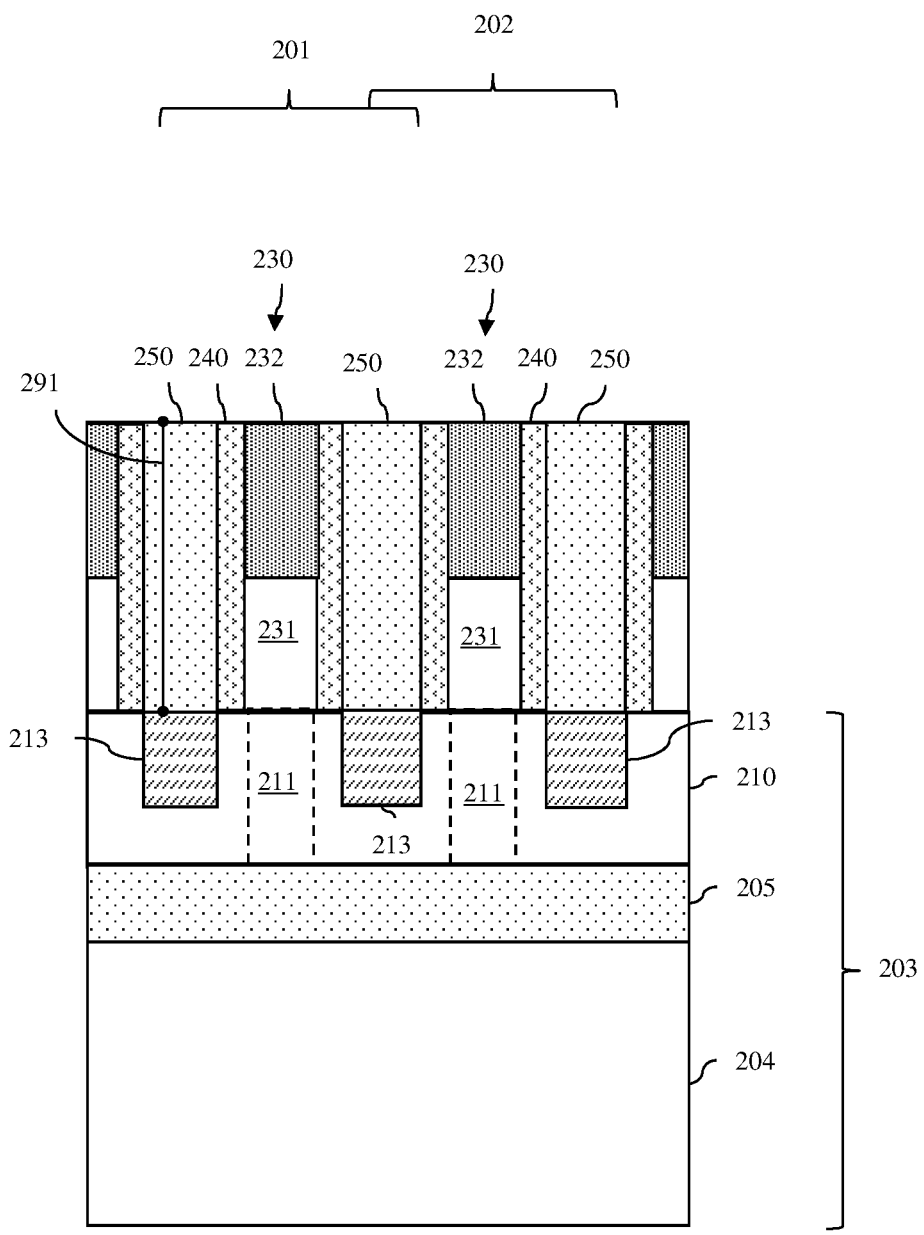

One or more field effect transistor (FET) structures (e.g., see FETs 201-202) can be formed on the semiconductor wafer 203 (see process 102 and FIGS. 2-3). For purposes of illustration, two FETs are shown. It should be understood that, alternatively, any number of one or more FETs could be formed at process 102. The FET(s) formed at process 102 can be, for example, fin-type field effect transistors (FINFETs), as described in greater detail below or illustrated in the figures. Alternatively, the FET(s) formed at process 102 can be any other suitable FET type that includes one or more channel regions positioned laterally between source/drain regions (e.g., planar FET(s), gate-all-around FETs, etc.). In any case, at this point in the processing, each FET 201, 202 can include: source/drain regions 213; a channel region 211 positioned laterally between the source/drain regions 213; a sacrificial gate 230 for replacement metal gate processing on the channel region 211; a gate sidewall spacer 240 on the sidewalls of the sacrificial gate 230, and sacrificial plugs 250 for replacement metal plug processing on the source/drain regions 213 and positioned laterally immediately adjacent to the gate sidewall spacer 240 (see process 102 and FIGS. 2-3).

For example, to form the FINFETs shown in the figure, a semiconductor fin 210 (i.e., a relatively thin, rectangular or fin-shaped, semiconductor body) can be formed on the semiconductor wafer. The semiconductor fin 210 can be patterned and etched from the semiconductor layer of an SOI wafer, as illustrated, or, alternatively, can be patterned and etched from the upper portion of a bulk semiconductor substrate (e.g., when isolation from the lower portion of the bulk semiconductor substrate is provided by buried well regions). Techniques for forming such a semiconductor fin 210 (e.g., lithographic patterning techniques or sidewall image transfer techniques) are well known in the art and, thus, the details have been omitted from this specification in order to allow the reader to focus on the salient aspects of the disclosed methods.

This semiconductor fin 210 can be either undoped or doped so that the channel regions 211 of the FETs will have a first type conductivity at a relatively low conductivity level. It should be understood that the first type conductivity will vary depending upon whether the FETs being formed are P-type FETs (PFETs) or N-type FETs (NFETs). That is, for PFETs the first type conductivity can be N-type so that the channel regions will have N− conductivity; for NFETs the first type conductivity can be P-type so that the channel regions have P− conductivity.

Sacrificial gate layers (including, for example, a sacrificial gate conductor layer 231 and a sacrificial gate cap layer 232) can be deposited over the semiconductor body 210. The sacrificial gate layers can then be lithographically patterned and etched to form sacrificial gates 230 adjacent to the channel regions 211. Those skilled in the art will recognize, in the case of FINFETs 201-202, the sacrificial gates 230 will be adjacent to the top surface and opposing sides of the semiconductor fin 210 at the channel regions 211.

Gate sidewall spacers 240 can be formed adjacent the sidewalls of the sacrificial gates 230. The gate sidewall spacers 240 can be formed, for example, using conventional sidewall spacer formation techniques, such that each gate sidewall spacer 240 laterally surrounds a corresponding sacrificial gate 230 and such that portions of the semiconductor fin 210 extend laterally beyond the gate sidewall spacer 240. The gate sidewall spacers 240 can be made of a first dielectric material. The first dielectric material can be, for example, silicon nitride, silicon oxynitride, or a low-K dielectric material. Those skilled in the art will recognize that a "low-K dielectric material" refers to a dielectric material with a dielectric constant that is less than that of silicon dioxide (i.e., less than 3.9). Exemplary low-K dielectric materials include, but are not limited to, carbon-doped silicon oxynitride (SiONC), carbon-doped silicon (SiC), silicon carbon nitride (SiCN), silicon oxycarbide (SiCO), and hydrogenated silicon oxycarbide (SiCOH).

Following gate sidewall spacer formation, source/drain processing can be performed to form source/drain regions 213 in the exposed portions of the semiconductor body 210 on either side of the sacrificial gates 230. The source/drain regions 213 can be formed so that they have a second type conductivity at a relatively high conductivity level. It should be understood that the second type conductivity will vary depending upon whether the FETs being formed are P-type PFETs or NFETs. That is, for PFETs the second type conductivity can be P-type so that the source/drain regions have P+ conductivity; for NFETs the second type conductivity can be N-type so that the source/drain regions have N+ conductivity. In any case, the source/drain regions 213 can be formed using dopant implant process to dope the exposed portions of the semiconductor fin 210. Alternatively, recesses can be formed in the exposed portions of the semiconductor fin 210 and in situ doped epitaxial semiconductor material (e.g., epitaxial silicon or any other suitable epitaxial semiconductor material) can be deposited within the recesses. Alternatively any other suitable source/drain processing could be performed to achieve source/drain regions 213 with the desired conductivity type and level. It should be noted that the figures show the top surfaces of the source/drain regions 213 being essentially level with the top surface of the semiconductor fin 210. This would be the case if the source/drain regions were formed as dopant implant regions. However, those skilled in the art will recognize that formation of epitaxial source/drain regions in recesses within the semiconductor fin could, instead, result in source/drain regions with top surfaces that are either higher or lower than the top surface of the semiconductor fin.

Sacrificial plugs 250 can then be formed on the source/drain regions 213 (see FIG. 3). For example, a second dielectric material, which is different from the first dielectric material, can be deposited so as to cover the source/drain regions 213 and, more particularly, to fill the spaces between the gate sidewall spacers 240 on adjacent sacrificial gates 230. The second dielectric material can be, for example, silicon dioxide. A polishing process (e.g., a chemical mechanical polishing (CMP) process) can be performed to expose the top surfaces of the sacrificial gates 230 and gate sidewall spacers 240, thereby forming the discrete sacrificial plugs 250 on each of the source/drain regions 213. As illustrated, these sacrificial plugs 250 will have a height 291, as measured from the top surface of the semiconductor fin 210.

Figure 4:
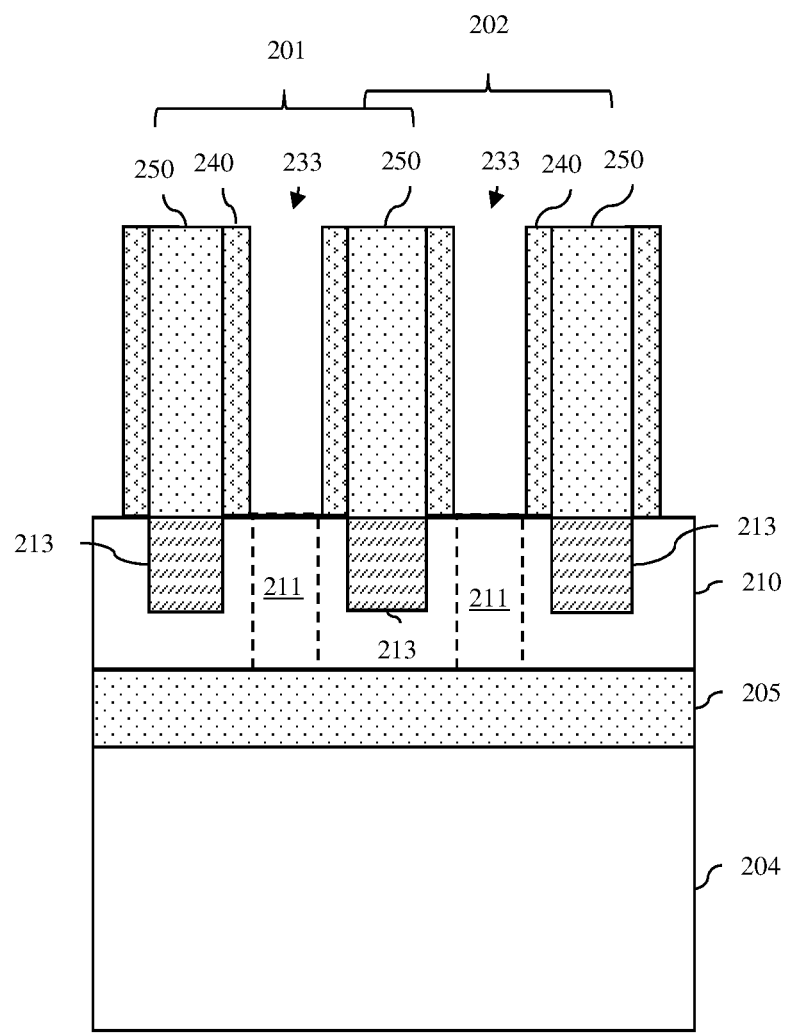

Next, replacement metal gate processing can be performed. That is, the sacrificial gates 230 can be selectively removed (e.g., using selective etch process to remove the layers 231-232) (see process 104 and FIG. 4). Removing the sacrificial gates 230 at process 104 creates gate openings 233 with each gate opening exposing a corresponding channel region 211 between a pair of source/drain regions 213. Techniques for sacrificial gate formation and subsequent removal are well known in the art and, thus, the details have been omitted from this specification in order to allow the reader to focus on the salient aspects of the disclosed methods.

Figure 5:
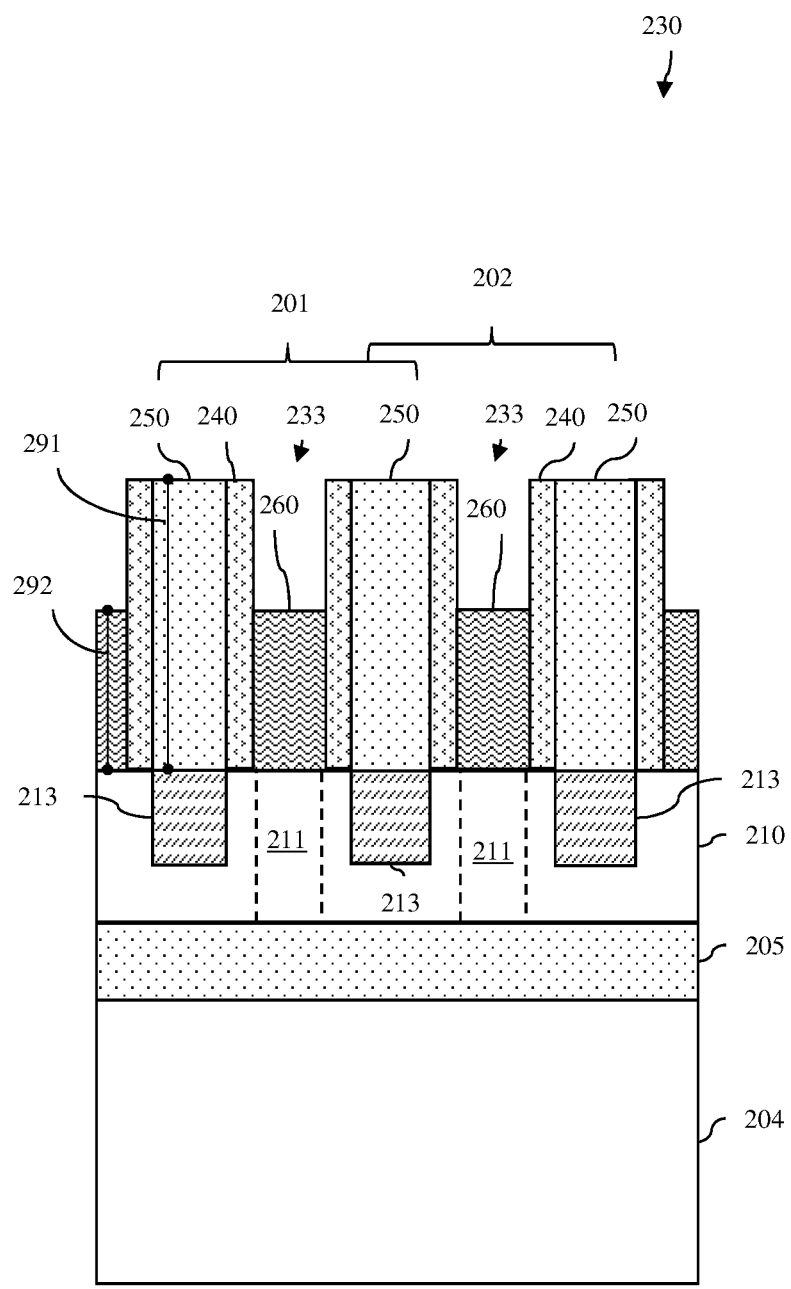

Once the sacrificial gates 230 are removed, replacement metal gates 260 can be formed within the lower portions of the gate openings 233 immediately adjacent to the channel regions 211 (see process 106 and FIG. 5). Techniques for forming replacement metal gates in gate openings are well known in the art and, thus, the details have been omitted from this specification in order to allow the reader to focus on the salient aspects of the disclosed methods. However, it should be understood that such gates will generally include a conformal high-K gate dielectric layer that is deposited so as to line the gate openings and one or more metal layers can be deposited onto the gate dielectric layer. The materials and thicknesses of the dielectric and metal layers used for replacement metal gates can be preselected to achieve desired work functions given the conductivity type of the FET. To avoid clutter in the drawings and to allow the reader to focus on the salient aspects of the disclosed methods, the different layers within the replacement metal gates 260 are not illustrated.

In any case, after deposition of the replacement metal gate materials into the gate openings, a polishing process (e.g., a CMP) process can be performed to remove all gate materials from above the top surfaces of the sacrificial plugs 250. Additionally, the gate materials can be recessed so that the replacement metal gates 260 so that they are only within the lower portions of the gate openings 233 and so that they have a desired height (i.e., a height 292, as measured from the top of the semiconductor body 210), which is less than the height 291 of the sacrificial plugs 250. In exemplary embodiments, the height 292 of the replacement metal gates 260 can be one-half the height 291 of the sacrificial plugs 250, one-third the height 291 of the sacrificial plugs 250, or even less. For example, in one exemplary embodiment, the height 291 of the sacrificial plugs 250 can be approximately 72 nm and the height 292 of the replacement metal gates 260 can be 24 nm.

Figure 6:
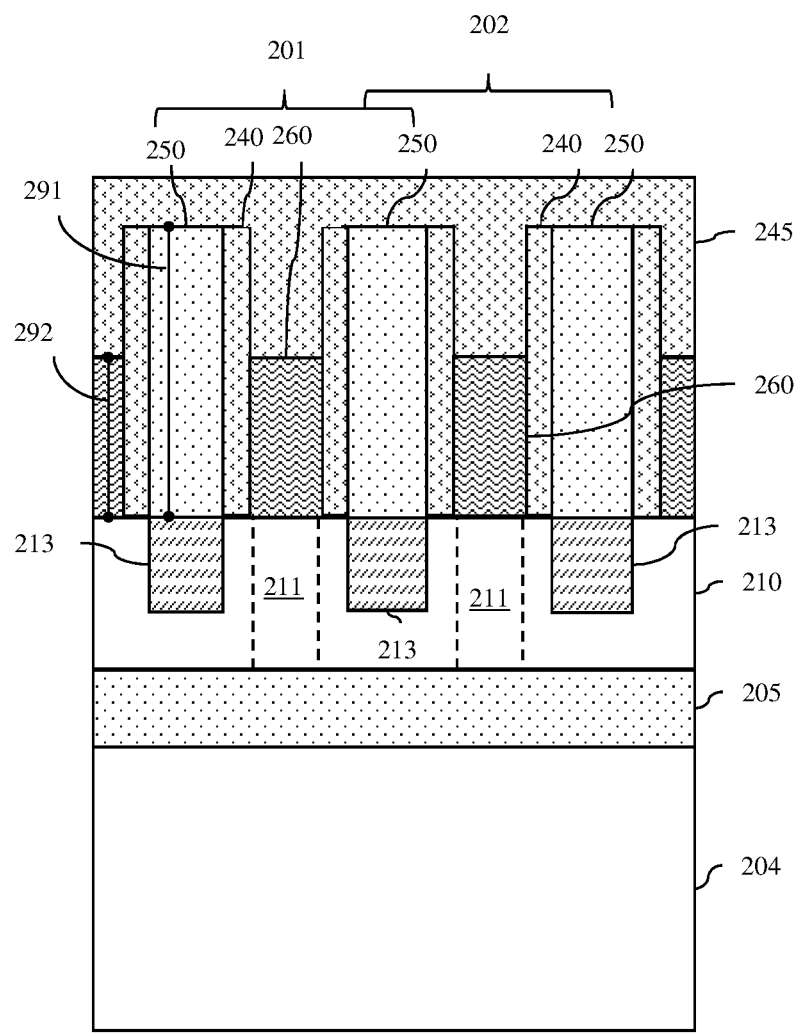

Next, a blanket gate cap layer 245 can be deposited over the partially completed structure (i.e., in the gate openings 233 and over the sacrificial plugs 250) (see process 108 and FIG. 6). The gate cap layer 245 can be the same first dielectric material used for the gate sidewall spacers 240. As discussed above, the first dielectric material can be silicon nitride, silicon oxynitride, or a low-K dielectric material (e.g., carbon-doped silicon oxynitride (SiONC), carbon-doped silicon (SiC), silicon carbon nitride (SiCN), silicon oxycarbide (SiCO), and hydrogenated silicon oxycarbide (SiCOH)). Alternatively, the gate cap layer 245 can be another dielectric material, which is different from both the first dielectric material of the gate sidewall spacers 240 and the second dielectric material of the sacrificial plugs 250, but which has essentially the same etch properties as the first dielectric material.

Optionally, a polishing process (e.g., a CMP process) can be performed so as to expose the top surfaces of the sacrificial plugs 250. However, preferably, in order to avoid sacrificial plug height loss (i.e., to retain the height 291), no such CMP process would be performed immediately following gate cap layer deposition at process 108.

Figure 7:
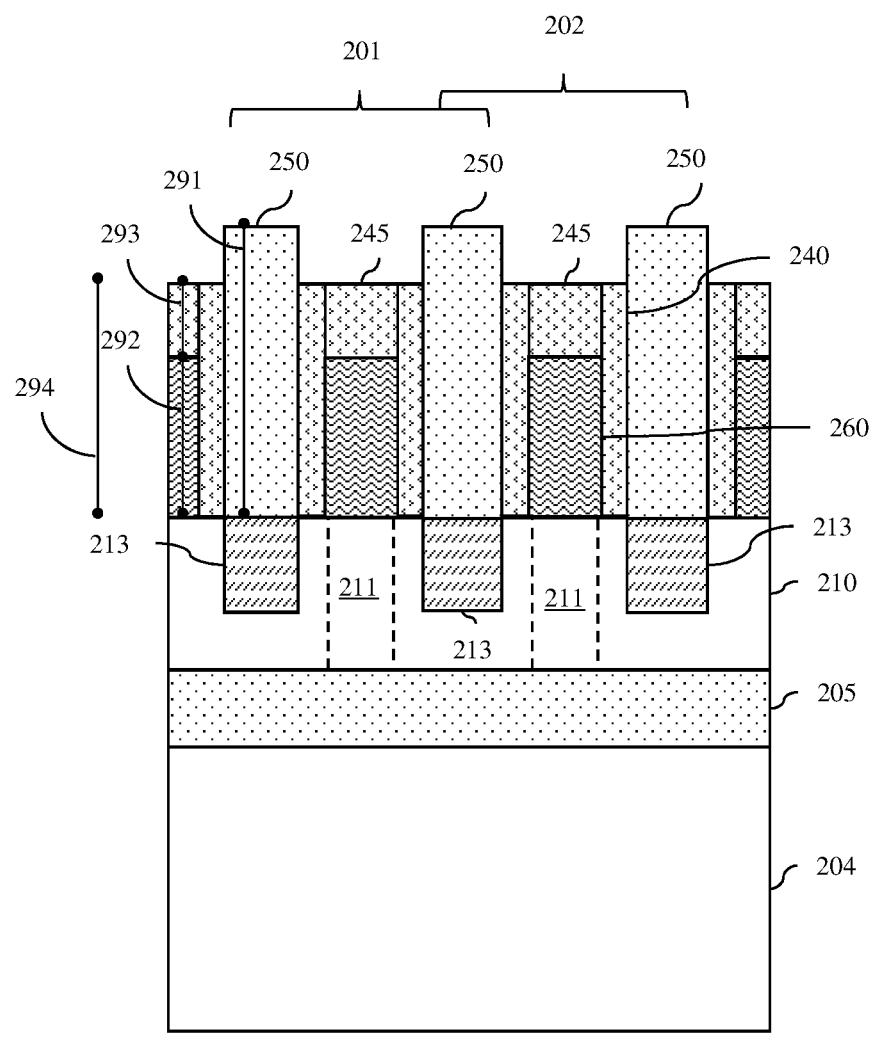

The gate cap layer 245 and the gate sidewall spacers 240 (which are made of the same first dielectric materials or different dielectric materials with the same etch properties) can be essentially simultaneously and selectively recessed (see process 110 and FIG. 7). This recessing process can be performed using, for example, an etch process that is selective for the first dielectric material of the gate cap layer 245 and the gate sidewall spacers 240 over the second dielectric material of the sacrificial plugs 250. That is, the etch process can recess the gate cap layer 245 and gate sidewall spacers 240 either without etching the sacrificial plugs 250 at all or only etching the sacrificial plugs 250 at a significantly slower rate. For example, if the gate cap layer and gate sidewall spacers are made of silicon nitride and the sacrificial plugs are made of silicon dioxide, any suitable etch process that selectively etches silicon nitride over silicon dioxide could be used at process 110. Techniques for selective etching of silicon nitride are well known in the art and, thus, the details of such techniques have been omitted from this specification in order to allow the reader to focus on the salient aspects of the disclosed methods.

In any case, recessing of the gate cap layer and gate sidewall spacers can be performed so as to empty out and widen the upper portions the gate openings 233, leaving gate caps 245 on the replacement metal gates 260 in the middle portions of the gate openings 233, respectively. Recessing of the gate cap layer and gate sidewall spacers can further be performed until the resulting gate caps 245 have a desired thickness (i.e., a specific thickness 293). In exemplary embodiments, the thickness 293 of the gate caps 245 can be equal to the height 292 of the replacement metal gates 260 or, alternatively, can be less than the height 292 of the replacement metal gates 260. In any case, this process will ensure that the top surfaces of the gate caps 245 and the gate sidewall spacers 240 are below the level of the top surfaces of the sacrificial plugs 250 and, more particularly, will ensure that the combined height 294 of each replacement metal gate 260 and gate cap 245 thereon, as measured from the top surface of the semiconductor fin 210, will be less than the height 291 of the sacrificial plugs 250.

For example, in one exemplary embodiment, the height 291 of the sacrificial plugs 250 can be 72 nm, the height 292 of the replacement metal gates 260 can be 24 nm and the thickness 293 of the gate caps 245 can be approximately 20 nm. Thus, the combined height 294 of each replacement metal gate 260 and gate cap 245 thereon will be 44 nm and the distance from the top surfaces of the gate caps 245 to the top surfaces of the sacrificial plugs 250 will be 28 nm.

The selective etch process used to recess the gate cap layer 245 and the gate sidewall spacers 240 will also remove the gate cap layer from the top surfaces of the sacrificial plugs 250 (if not previously done using a CMP process).

Figure 8:
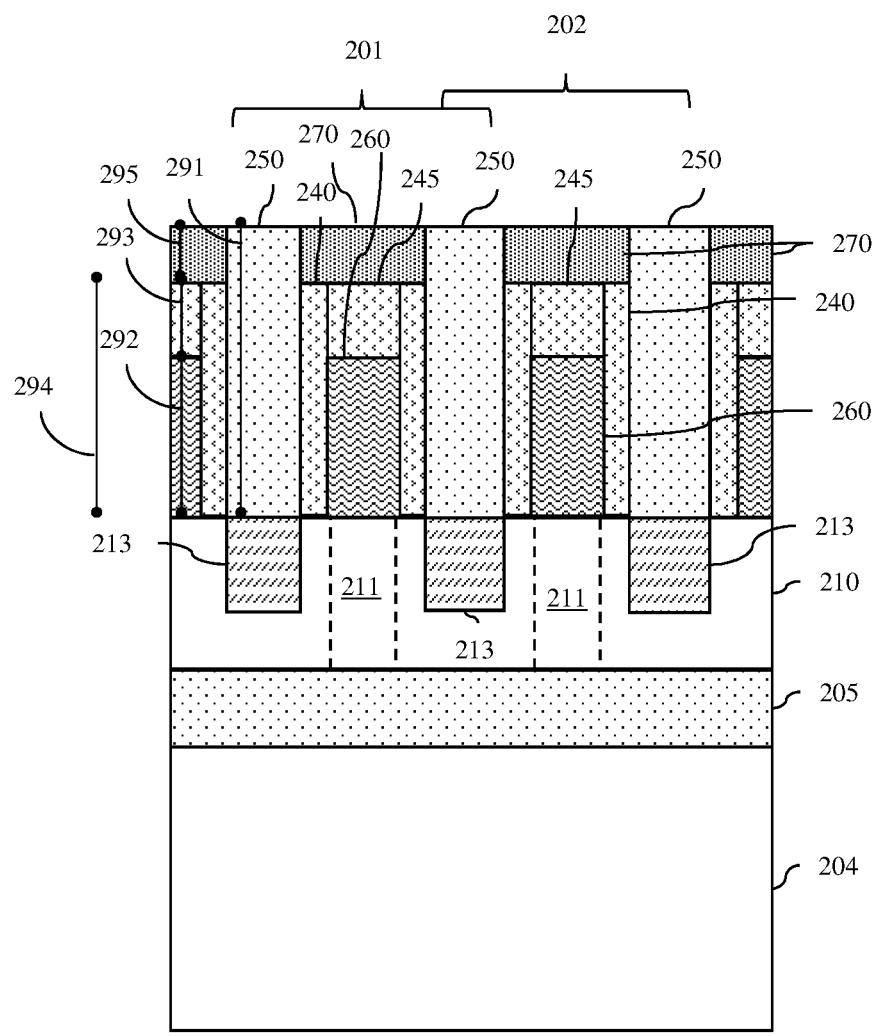

Next, sacrificial caps 270 can be formed within the upper portions of the gate openings 233 (see process 112 and FIG. 8). Specifically, a sacrificial cap layer can be deposited so as to fill the upper portions of the gate openings 233 and a polishing process (e.g., a CMP process) can be performed so as to remove the sacrificial cap layer from above the top surfaces of the sacrificial plugs 250. As a result, sacrificial caps 270 are formed in the upper portions of the gate openings 233 with each sacrificial cap 270 being above and immediately adjacent to the top surface of a gate cap 245 and further extending laterally over the top surface of the adjacent gate sidewall spacer 240. Furthermore, the top surfaces of the sacrificial caps 270 will be essentially co-planar with the top surfaces of the sacrificial plugs 250. Thus, at this point in the processing, the sacrificial caps 270 will have a thickness 295, which is equal to the distance between the top surfaces of gate caps 245 and the top surfaces of the sacrificial plugs. Additionally, a combined height of each gate stack, which includes a replacement metal gate 260, a gate cap 245 on the replacement metal gate 260, and a sacrificial cap 270 on the gate cap 245, will be essentially equal to the height 291 of the sacrificial plugs 250.

It should be noted that the sacrificial cap layer deposited at process 112 can be made of one or more sacrificial materials. The sacrificial material(s) can be different from the first dielectric material of the gate caps 245 and the gate sidewall spacers 240, different from the second dielectric material of the sacrificial plugs 250 and also different from the metal material that will subsequently be used at process 116 during replacement metal plug processing, discussed in greater detail below. For example, the sacrificial material(s) of the sacrificial cap layer can include a metal material (e.g., tungsten) and, optionally, a conformal barrier material layer (e.g., a conformal titanium nitride layer) between the metal material and the adjacent dielectric material. Alternatively, the sacrificial material can be polysilicon. Alternatively, the sacrificial material can be a third dielectric material and, particularly, a high-K dielectric material. Those skilled in the art will recognize that a high-K dielectric materials refers to a dielectric material with a dielectric constant that is greater than that of silicon dioxide (i.e., less than 3.9). Exemplary high-K dielectric materials include, but are not limited to, hafnium dioxide, alumina or aluminum nitride.

Figure 9:
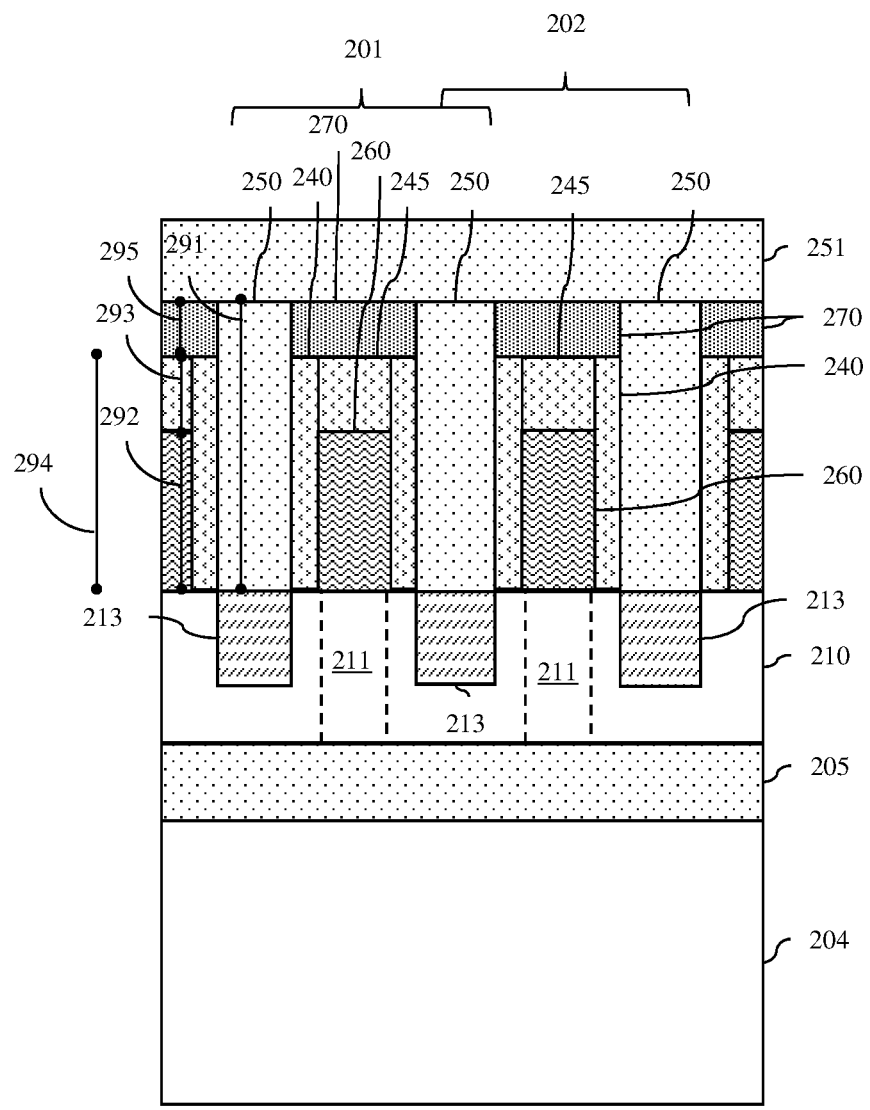

Following formation of the sacrificial caps 270, replacement metal plug processing can be performed. That is, the sacrificial plugs 250 can be selectively removed to form metal plugs openings 254, which expose the source/drain regions 213, respectively (see process 114 and FIGS. 9-11).

Figure 10:
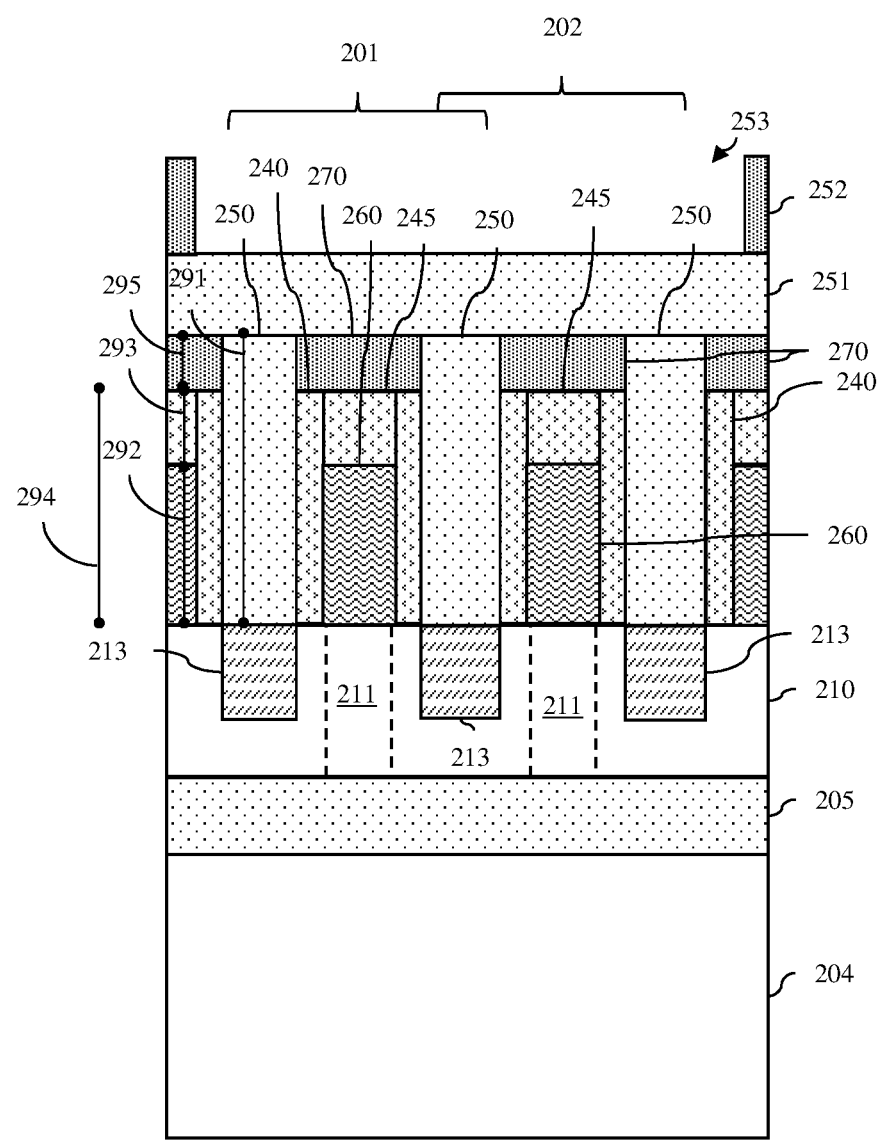
Figure 11:
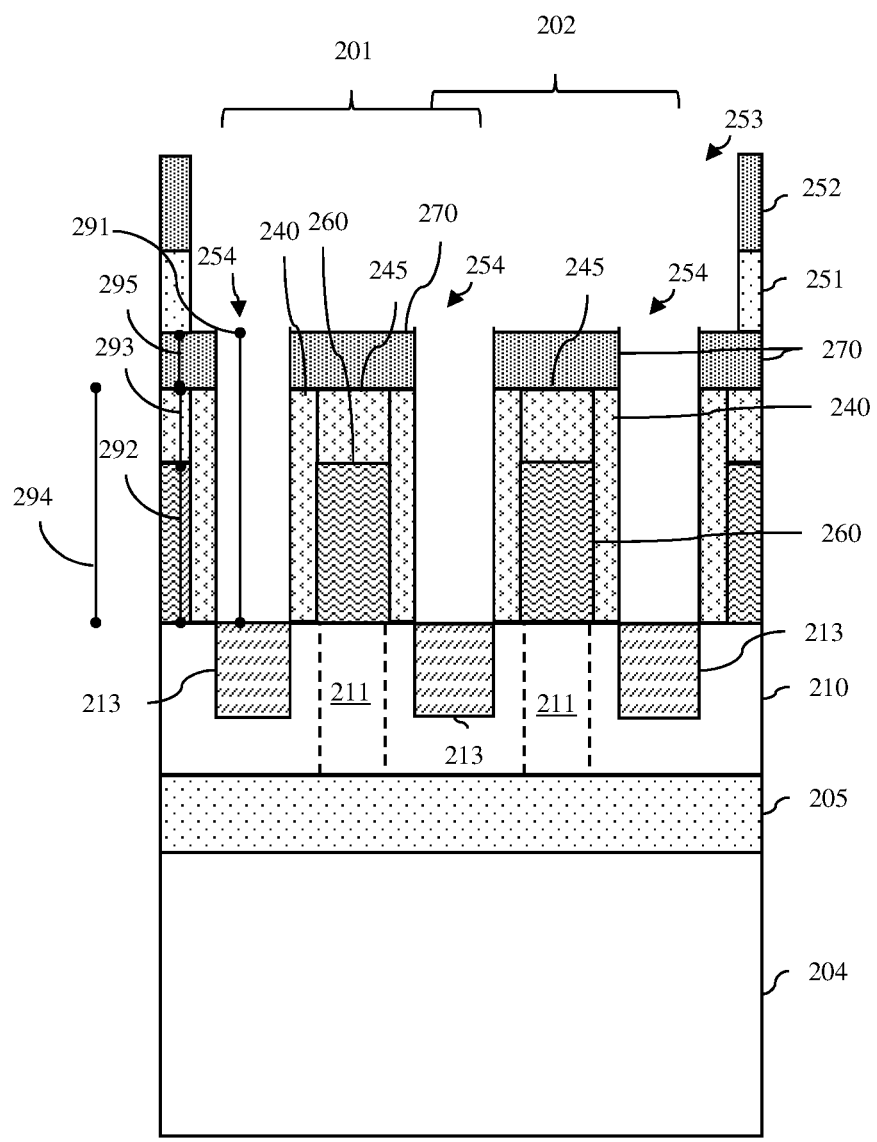

For example, a mask layer 251 (e.g., made of the second dielectric material, e.g., silicon dioxide) can be formed on the top surfaces of the sacrificial caps 270 and sacrificial plugs 250 (see FIG. 9) and an organic planarization layer (OPL) 252 can be formed on the mask layer 251 (see FIG. 10). Conventional lithographic processing can be performed in order to form an opening 253 in the OPL 252 so as to expose an area of the wafer within which metal plugs are to be formed. An anisotropic etch process can then be performed to etch the second dielectric material of the mask layer 251 and the sacrificial plugs 250 over the sacrificial material of the sacrificial caps 270, over the first dielectric material of the gate caps 245 and the gate sidewall spacers 240, and over semiconductor material of the source/drain regions 213. That is, the anisotropic etch process can etch the sacrificial plugs 250 either without etching the sacrificial caps 270 or gate sidewall spacers 240 at all or only etching them at a significantly slower rate. For example, if the sacrificial caps 270 are made of tungsten, the gate sidewall spacers 240 are made of silicon nitride and the sacrificial plugs 250 are made of silicon dioxide, then any suitable etch process that is selective for silicon dioxide over both tungsten and silicon nitride could be used to selectively remove the sacrificial plugs 250 at process 114. Techniques for selective etching of silicon dioxide are well known in the art and, thus, the details of such techniques have been omitted from this specification in order to allow the reader to focus on the salient aspects of the disclosed methods.

Figure 12:
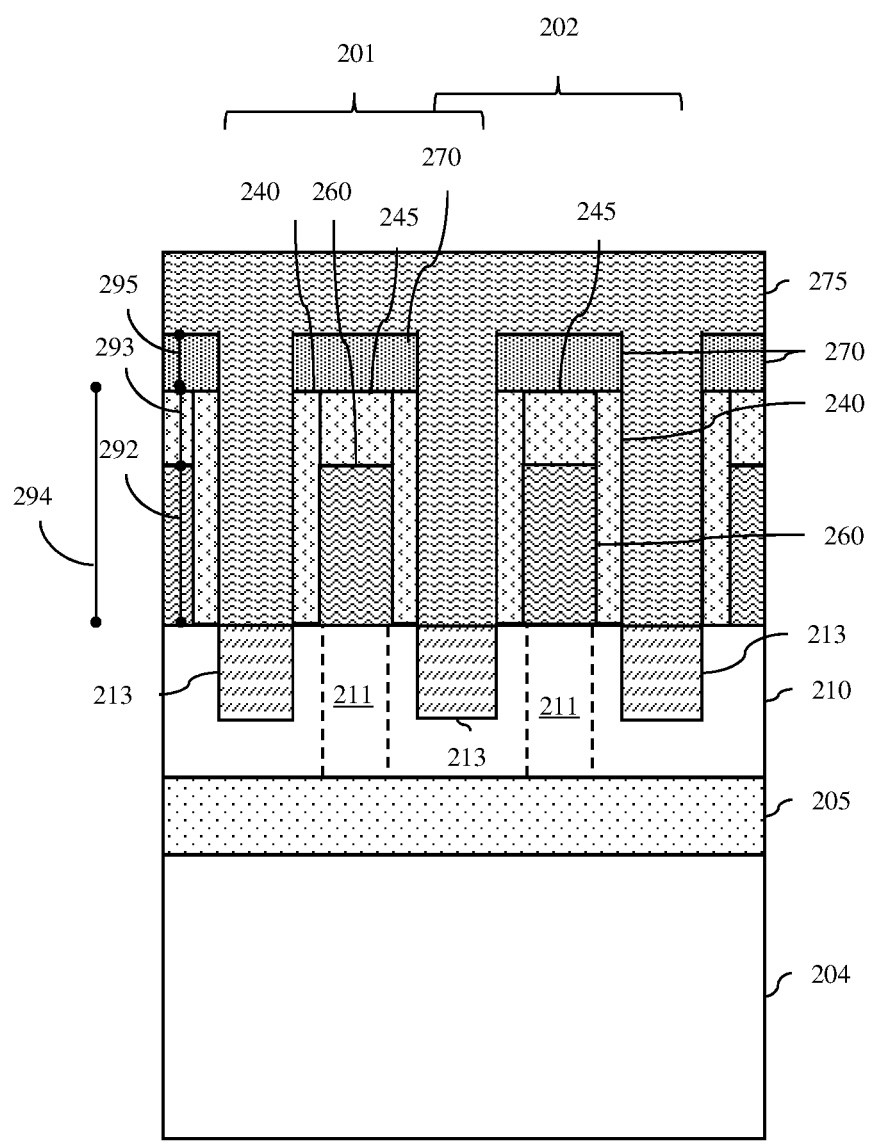
Figure 13:
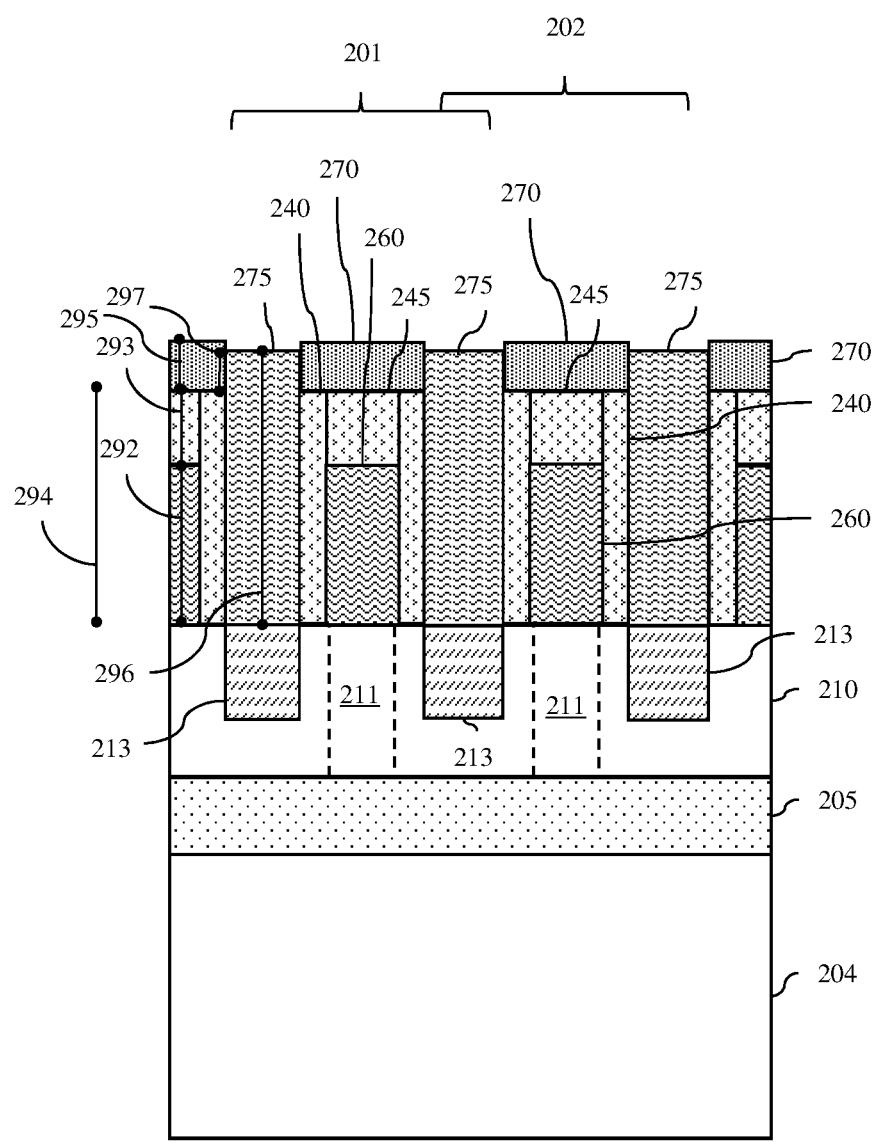

The remaining OPL and mask materials can then be removed and metal plugs 275 can be formed in the metal plug openings 254 (see process 116 and FIGS. 12-13). For example, a metal material (e.g., cobalt) can be deposited (e.g., using conventional cobalt deposition techniques) so as to fill the metal plugs openings (see FIG. 12). Metal deposition can be followed by a polishing process (e.g., a CMP process) to remove any of the metal material from above the top surfaces of the sacrificial caps 270, thereby forming the metal plugs 275. Optionally, as illustrated in FIG. 13, a recessing process can also be performed wherein the metal material of the metal plugs 275 is selectively recessed so that the top surfaces of the metal plugs 275 are at a level below the level of the top surfaces of the sacrificial caps 270, but still above the level of the top surfaces of the gate caps 245 and gate sidewall spacers 240 by some distance 297. Thus, the metal plugs 275 will have a height 296 that may be somewhat less than the height 291 of the sacrificial plugs 250 but will still be greater than the combined height 294 of the replacement metal gate 260 with the gate cap 245 thereon. Furthermore, it should be noted that the metal CMP and optional recess may reduce the thickness 295 of the sacrificial caps 270, but will not have an impact on the unexposed gate caps 245 below (i.e., will not reduce the thickness of the gate caps).

The metal plugs 275 formed at process 116 are considered to be "self-aligned" because the plug openings are formed without requiring a specific lithographic patterning process and the metal plugs are formed by depositing metal into the plug openings also without requiring a specific patterning process. Furthermore, the technique of using sacrificial caps 270 on the gate caps 245 above the gates 260 allows for the formation of relatively tall metal plugs 275. That is, the metal plugs formed at process 116 can have top surfaces that are above the level of the top surfaces of the gate caps 245 and gate sidewall spacers 240. Furthermore, this technique ensures that the desired thickness 293 of the gate caps 245 is retained throughout process and, thus, ensures that the combined height 294 of each replacement metal gate 260 and gate cap 245 thereon is also retained.

Figure 14:
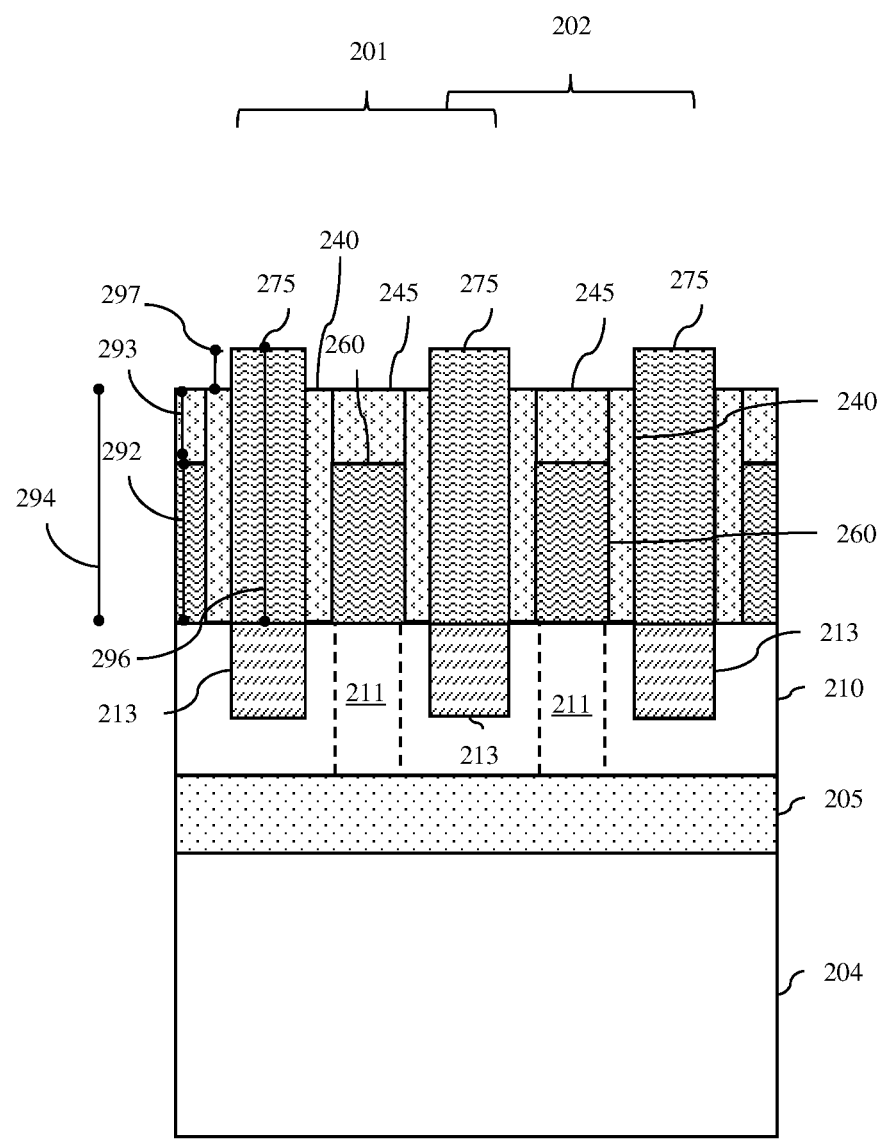

Following formation of the metal plugs 275, the sacrificial caps 270 can be selectively removed (see process 118 and FIG. 14). Specifically, an etch process can be performed that selectively etches the sacrificial material of the sacrificial caps 270 over the first dielectric material of the gate caps 245 and the gate sidewall spacer 240 and over the metal material of the metal plugs 275. That is, the etch process can etch the sacrificial caps 270 either without etching the gate caps 245, the gate sidewall spacers 240, and the metal plugs 275 at all or only etching them at a significantly slower rate. For example, if the sacrificial caps 270 are made of tungsten, the gate caps 245 and gate sidewall spacers 240 are made of silicon nitride and the metal plugs 275 are made of cobalt, then an etch process that selectively etches tungsten over silicon nitride and cobalt can be performed to remove the sacrificial caps 270 at process 118. Techniques for selective etching of tungsten are well known in the art and, thus, the details of such techniques have been omitted from this specification in order to allow the reader to focus on the salient aspects of the disclosed methods.

Figure 15:
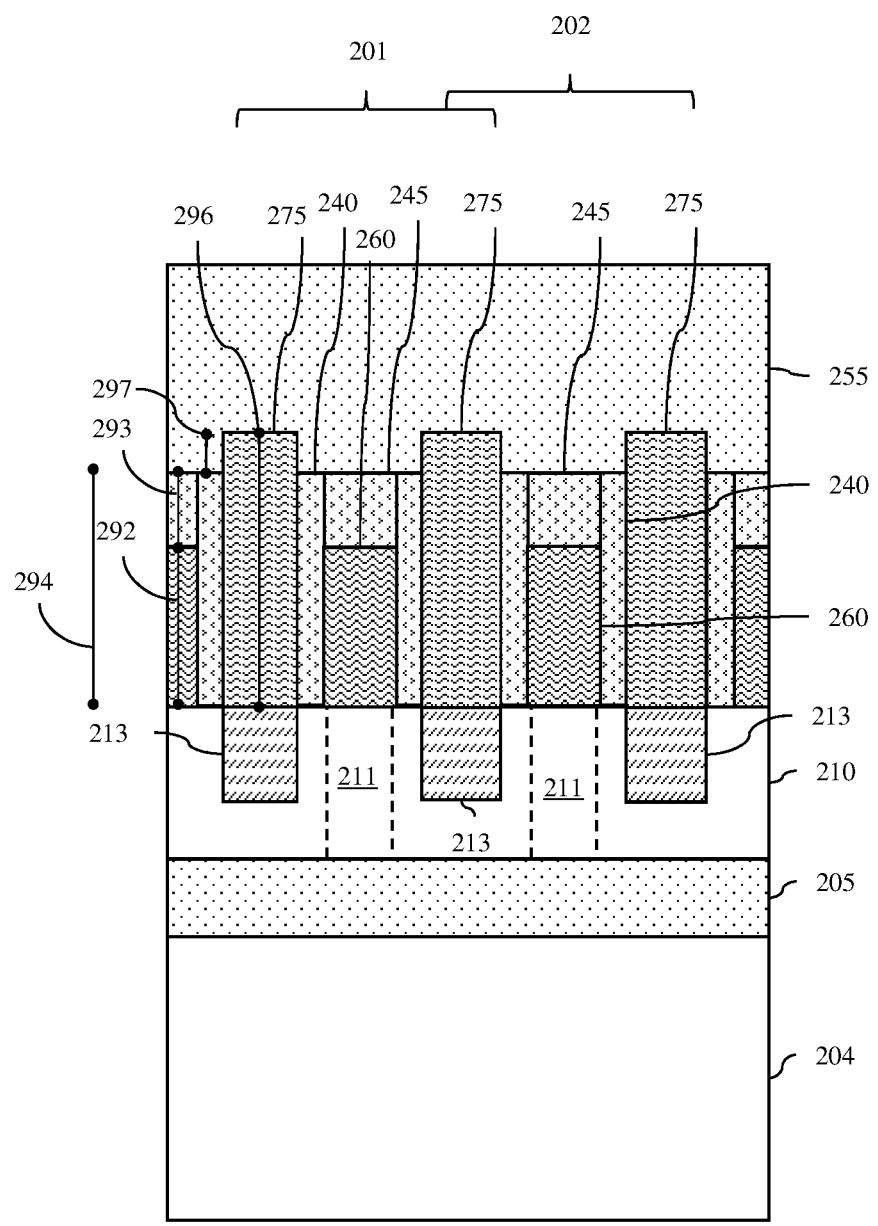

At this point in the processing, the upper ends of the metal plugs 275 will extend vertically above the level of the top surfaces of the gate caps 245 and gate sidewall spacers 240 and the top and side surfaces of those upper ends will be exposed. A blanket interlayer dielectric (ILD) layer 255 can be deposited onto this partially completed structure (see process 120 and FIG. 15). This ILD layer 255 can be made, for example, of the second dielectric material (e.g., silicon dioxide) and will cover and be immediately adjacent to the top surfaces of the gate caps 245 and gate sidewall spacers 240 and will also cover and be immediately adjacent to the top and side surfaces of the upper ends of the metal plugs 275.

Figure 16:
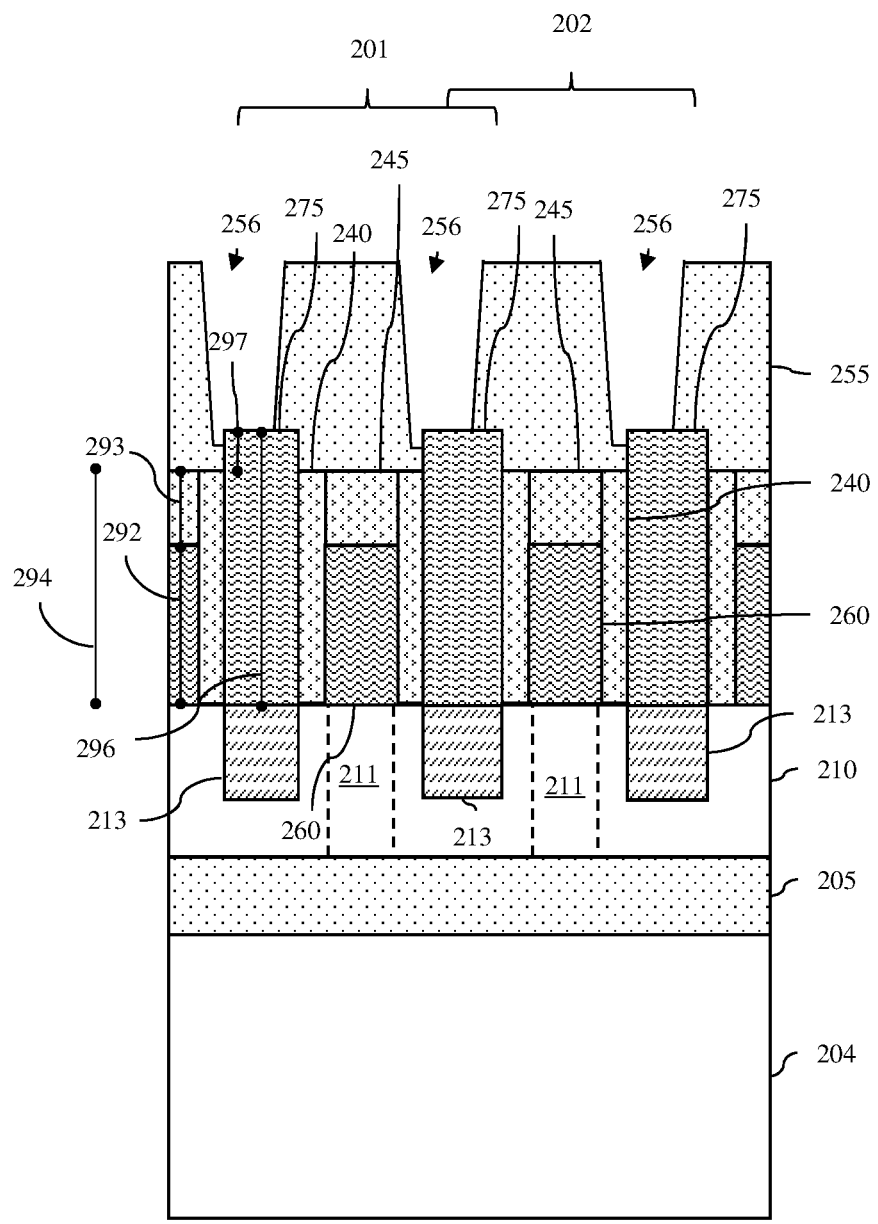
Figure 17:
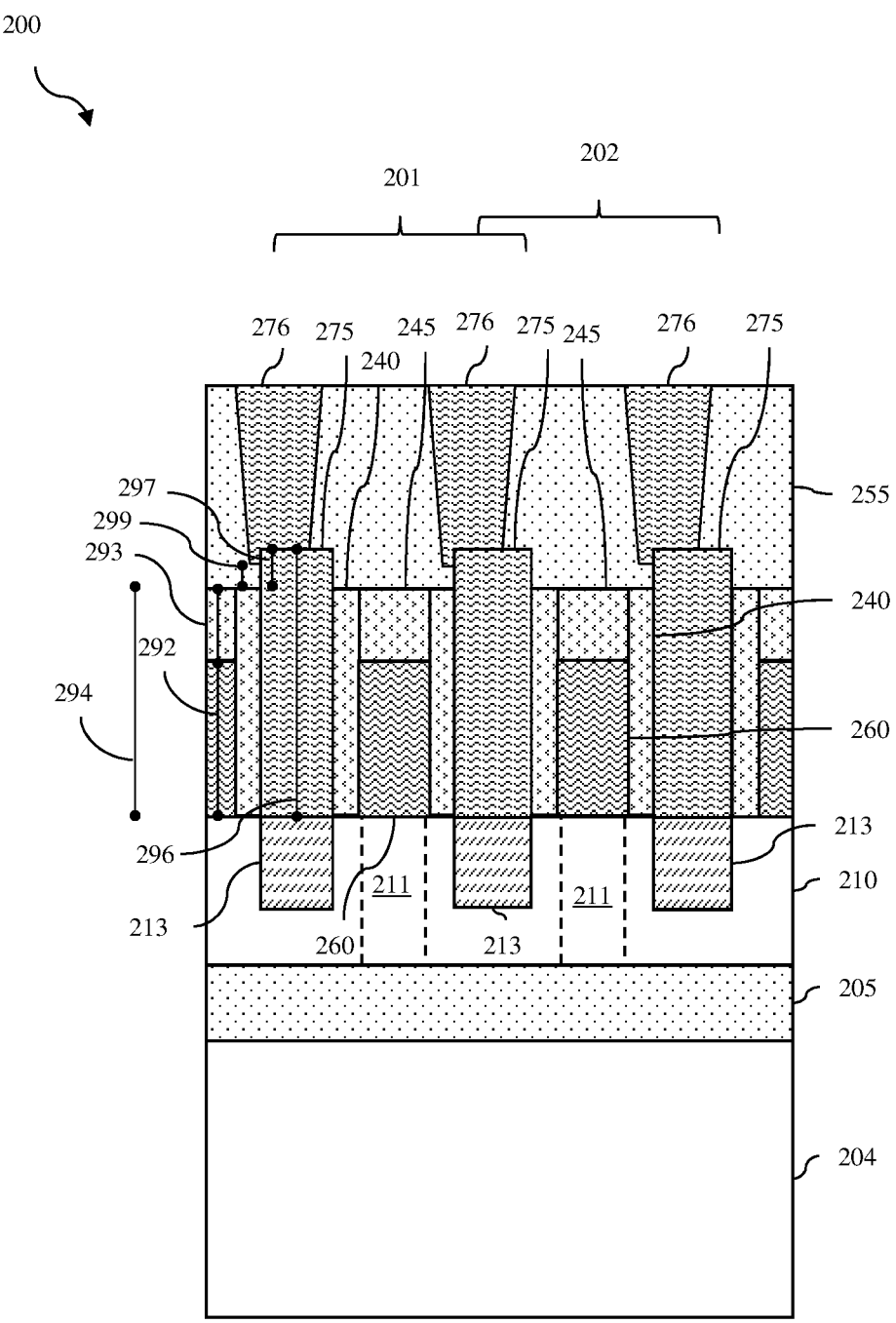
FIG. 17 is a cross-section diagram illustrating a completed IC structure formed according to the flow diagram of FIG. 1.

Source/drain contacts 276 can then be formed through the ILD layer 255 to the metal plugs 275, respectively (see process 122 and FIGS. 16-17). Specifically, lithographic patterning and etch processes can be used to form source/drain contact openings 256 that extend essentially vertically through the ILD layer 255 to the metal plugs 275 (see FIG. 16). Then, conventional MOL metallization processes can be performed so as to fill the openings with a conductor, thereby forming the source/drain contacts 276.

It should be noted that the source/drain contact etch process can be selective for the ILD material over the metal material of the metal plugs and should be timed to stop upon exposure of the metal plugs 275 but may result in divot formation at the sides of the metal plugs. Since the upper ends of the metal plugs 275 extend some distance 297 above the level of the top surfaces of the gate caps 245, any divots that form at the sides of the metal plugs 275 will not extend down to the gate caps 245 or adjacent gate sidewall spacers 240. In other words, the taller metal plugs 275 compensate for any over-etching around the sides of the metal plugs 275, thereby preventing exposure of the gate caps 245 and gate sidewall spacer 240. As a result, when the source/drain contacts 276 are formed, they may contact (i.e., be immediately adjacent to) both the top and side surfaces of the upper portions of the metal plugs 275. However, the bottom surfaces of those source/drain contacts 276 will still be at least some minimum distance 299 above the level of the top surfaces of the gate caps 245 and gate sidewall spacers 240.

Thus, in the resulting IC structure 200 shown in FIG. 17, the risk of shorts occurring between the replacement metal gates 260 and either the metal plugs 275 or the source/drain contacts 276 is minimized.

Referring to FIG. 17, also are integrated circuits (ICs) 200 formed, according to the above-described methods, so as to include one or more field effect transistors (FET) 201-202 (e.g., fin-type field effect transistors (FINFETs)) with self-aligned metal plugs 275 on the source/drain regions 213.

Specifically, an IC structure 200 can include a substrate and one or more FETs on the substrate. The substrate can be a semiconductor-on-insulator substrate (e.g., a silicon-on-insulator (SOI) wafer) that includes a semiconductor substrate 204 (e.g., a silicon substrate), an insulator layer 205 (e.g., a buried oxide (BOX) layer or other suitable insulator layer on the semiconductor substrate) on the substrate 204 and a semiconductor layer on the insulator layer 205. The active regions of the FET(s) can be formed within a semiconductor body (e.g., a semiconductor fin 210) that is patterned from the semiconductor layer. Alternatively, the substrate can include a bulk semiconductor substrate (e.g., a bulk silicon wafer or other suitable bulk semiconductor wafer) and the active regions of the FET(s) can be formed within a semiconductor body (e.g., a semiconductor fin 210) that is patterned into the upper portion of the bulk semiconductor substrate.

For purposes of illustration, two FETs 201 and 202 are shown in FIG. 17. It should be understood that, alternatively, the IC 200 can include any number of one or more FETs. Additionally, for purposes of illustration, the FETs 201 and 202 shown in FIG. 17 are fin-type field effect transistors (FINFETs). It should be understood that, alternatively, the IC 200 could include any other suitable FET type that includes one or more channel regions positioned laterally between source/drain regions (e.g., planar FET(s), gate-all-around FETs, etc.).

In any case, each FET 201, 202 can include a channel region 211 that is positioned laterally between source/drain regions 213. Channel regions 211 can be undoped or doped so as to have a first type conductivity at a relatively low conductivity level. It should be understood that this first type conductivity will vary depending upon whether the FETs are P-type FETs (PFETs) or N-type FETs (NFETs). For example, for PFETs the channel regions can have N− conductivity and for NFETs the channel regions can have P− conductivity. The source/drain regions 213 have a second type conductivity at a relatively high conductivity level. Again, it should be understood that the second type conductivity will also vary depending upon whether the FETs are PFETs or NFETs. That is, for PFETs the source/drain regions can have P+ conductivity; for NFETs the source/drain regions can have N+ conductivity. As mentioned above, with FINFETs in particular the channel regions 211 can be within a semiconductor body and, particularly, within a semiconductor fin 210 and the source/drain regions 213 can be wither dopant implant regions or epitaxial semiconductor-filled recesses in the semiconductor fin 210 on opposing sides of each channel region 211.

Each FET 201, 202 can further include a replacement metal gate 260 adjacent to the channel region 211. A replacement metal gate 260 can include a conformal high-K gate dielectric layer and one or more metal layers on the gate dielectric layer. The materials and thicknesses of the dielectric and metal layers used for replacement metal gates can be preselected to achieve desired work functions given the conductivity type of the FET. To avoid clutter in the drawings and to allow the reader to focus on the salient aspects of the disclosed methods, the different layers within the replacement metal gates 260 are not illustrated.

Each FET 201, 202 can further include a gate cap 245 on the top surface of the replacement metal gate 260 and a gate sidewall spacer 240 positioned laterally immediately adjacent to the sidewalls of the replacement metal gate 260 and, particularly, laterally surrounding the replacement metal gate 260. The gate sidewall spacer 240 can further extend vertically upward so as to be adjacent to the sidewalls of the gate cap 245 above the replacement metal gate 260. The top surfaces of each gate cap 245 and the adjacent gate sidewall spacer 240 can be substantially co-planar. The gate cap 245 and gate sidewall spacer 240 can be made of a first dielectric material. The first dielectric material can be, for example, silicon nitride, silicon oxynitride, or a low-K dielectric material. Those skilled in the art will recognize that a "low-K dielectric material" refers to a dielectric material with a dielectric constant that is less than that of silicon dioxide (i.e., less than 3.9). Exemplary low-K dielectric materials include, but are not limited to, carbon-doped silicon oxynitride (SiONC), carbon-doped silicon (SiC), silicon carbon nitride (SiCN), silicon oxycarbide (SiCO), and hydrogenated silicon oxycarbide (SiCOH).

The IC structure 200 can further include metal plugs 275 on the source/drain regions 213. The metal plugs 275 can be "self-aligned" as discussed further in the detailed above with regard to the disclosed methods. The metal plugs 275 can be, for example, cobalt plugs. Alternatively, the metal plugs 275 can be made of any suitable metal plug material. Each metal plug 275 can be positioned above and immediately adjacent to a source/drain region 213. Each metal plug 275 can further be positioned laterally immediately adjacent a portion of a gate sidewall spacer 240 on a replacement metal gate 260 and, optionally between and immediately adjacent to portions of gate sidewall spacers 240 on adjacent replacement metal gates 260 (as illustrated). As measured from the top surface of the semiconductor fin 210, the height 296 of the metal plugs 275 can be greater than the height 294 of a gate stack that includes the replacement metal gate 260 and gate cap 245 thereon. Thus, the metal plugs 275 can have upper ends that extend vertically above the level of the top surfaces of the gate caps 245 and gate sidewall spacers 240. That is, for a given FET 202 or 202, the top surfaces of the metal plugs 275 on either side of the replacement metal gate 260 will be some distance 297 above the level of the top surfaces of the gate cap 245 and the gate sidewall spacer 240 on that replacement metal gate 260.

The IC structure 200 can further include a blanket interlayer dielectric (ILD) layer 255. The blanket ILD layer 255 can be made of a second dielectric material that is different from the first dielectric material of the gate caps 245 and gate sidewall spacers 240. The second dielectric material can be, for example, silicon dioxide. The ILD layer 255 can be on the top surfaces of the gate cap 245 and gate sidewall spacer 240 on each replacement metal gate 260 and can further cover the upper ends (i.e., the top and side surfaces of the upper ends) of the metal plugs 275 adjacent to each replacement metal gate 260.

Source/drain contacts 276 can extend essentially vertically through the ILD layer 255 to the upper ends of metal plugs 275. The source/drain contacts 276 can land on the top surfaces of the metal plugs 275 such that the bottom surfaces of these source/drain contacts 276 are above the level of the top surfaces of any adjacent gate caps 245 or gate sidewall spacers 240. Furthermore, given that the metal plugs 275 are relatively tall, in the case were divots are formed in the ILD material adjacent to the sides of the metal plugs and contact material is deposited into the divots during processing such that the source/drain contacts 276 are immediately adjacent to the top and sides of the metal plugs 275, the bottom surfaces of these source/drain contacts 276 are still above the level of the top surfaces of any adjacent gate caps 245 or gate sidewall spacers 240 (i.e., separated therefrom by some distance 299). Thus, the risk of shorts occurring between the replacement metal gates 260 and either the metal plugs 275 or the source/drain contacts 276 is minimized.

In the disclosed methods and structures the FETs 201, 202 can be NFETs or PFETs. As mentioned above, for a PFET, the channel region(s) can have N-type conductivity at a relatively low conductivity level (or can be undoped) and the source/drain regions can have P-type conductivity at a relatively high conductivity level; whereas, for an NFET, the channel region(s) can have P-type conductivity at a relatively low conductivity level (or can be undoped) and the source/drain regions can have N-type conductivity and a relatively high conductivity level. Those skilled in the art will recognize that different dopants can be used to achieve the different conductivity types and that the dopants may vary depending upon the different semiconductor materials used. For example, a silicon-based semiconductor material (e.g., silicon, silicon germanium, etc.) having P-type conductivity is typically doped with a P-type dopant (e.g., a Group III dopant, such as boron (B) or indium (In)), whereas a silicon-based semiconductor material having N-type conductivity is typically doped with an N-type dopant (e.g., a Group V dopant, such as arsenic (As), phosphorous (P) or antimony (Sb)). Alternatively, a gallium nitride (GaN)-based semiconductor material having P-type conductivity is typically doped with magnesium (Mg), whereas a gallium nitride (GaN)-based semiconductor material having N-type conductivity is typically doped with silicon (Si). Those skilled in the art will also recognize that different conductivity levels will depend upon the relative concentration levels of the dopants.

Additionally, in the disclosed methods and structures the replacement metal gates (RMGs) 260 can include a metal gate conductor with a work function suitable for either NFET or PFET operation. Alternatively, for NFETs, the RMGs gates can have a first work function, whereas, for PFETs, the RMGs gates can have a second work function that is different from the first work function. Specifically, the RMGs can have a high-K gate dielectric layer. Those skilled in the art will recognize that a high-K gate dielectric layer refers to a gate dielectric layer made of a dielectric material with a dielectric constant that is greater than the dielectric constant of silicon dioxide (i.e., greater than 3.9). Exemplary high-K dielectric materials include, but are not limited to, hafnium (HO-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). The optimal gate conductor work function of NFETs can be, for example, between 3.9 eV and about 4.2 eV. Exemplary metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The optimal gate conductor work function for PFETs can be, for example, between about 4.9 eV and about 5.2 eV. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). Any conductive fill material used can be a fill metal or fill metal alloy, such as tungsten, a tungsten alloy (e.g., tungsten silicide or titanium tungsten), cobalt, aluminum or any other suitable fill metal or fill metal alloy.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed methods and structures and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A structure comprising:
 a transistor comprising: source/drain regions; a channel region positioned laterally between the source/drain regions; a gate adjacent to the channel region; a gate cap on a top surface of the gate; and a gate sidewall spacer positioned laterally adjacent to the gate, wherein top surfaces of the gate cap and the gate sidewall spacer are substantially co-planar;
metal plugs on the source/drain regions, wherein the metal plugs are positioned laterally immediately adjacent to the gate sidewall spacer and wherein top surfaces of the metal plugs are a first distance above a level of the top surfaces of the gate cap and the gate sidewall spacer;
an interlayer dielectric layer on the gate cap, the gate sidewall spacer and the metal plugs; and
source/drain contacts extending into the interlayer dielectric layer and contacting the metal plugs, wherein bottom surfaces of the source/drain contacts are a second distance above the level of the top surfaces of the gate cap and the gate sidewall spacer and wherein the second distance is less than the first distance.

2. The structure of claim 1, wherein the metal plugs comprise cobalt plugs.

3. The structure of claim 1, wherein each source/drain contact is immediately adjacent to a top surface and a side surface of an upper end of a metal plug.

4. The structure of claim 1, wherein at least one source/drain contact extends over the gate sidewall spacer and a bottom surface of the at least one source/drain contact is physically separated from the gate sidewall spacer by a portion of the interlayer dielectric layer.

5. The structure of claim 1, wherein the gate cap and the gate sidewall spacer comprise a first dielectric material and wherein the interlayer dielectric layer comprises a second dielectric material that is different from the first dielectric material.

6. The structure of claim 1, wherein the gate cap and the gate sidewall spacer comprise silicon nitride, silicon oxynitride or a low-K dielectric material, and wherein the interlayer dielectric layer comprises silicon dioxide.

7. The structure of claim 1, wherein the gate sidewall spacer comprises a single layer of spacer material and wherein each metal plug fills a space between the gate sidewall spacer and an additional gate sidewall spacer of an additional transistor that shares a source/drain region with the transistor.

8. A structure comprising:
a transistor comprising: source/drain regions; a channel region positioned laterally between the source/drain regions; a gate adjacent to the channel region; a gate cap on a top surface of the gate; and a gate sidewall spacer positioned laterally adjacent to the gate, wherein top surfaces of the gate cap and the gate sidewall spacer are substantially co-planar;
metal plugs on the source/drain regions, wherein the metal plugs are positioned laterally immediately adjacent to the gate sidewall spacer and wherein top surfaces of the metal plugs are above a level of the top surfaces of the gate cap and the gate sidewall spacer;
an interlayer dielectric layer immediately adjacent to the top surfaces of the gate cap and the gate sidewall spacer and further extending over upper ends of the metal plugs such that the interlayer dielectric layer is immediately adjacent to a top surface and side surfaces of each metal plug; and
source/drain contacts extending into the interlayer dielectric layer and contacting the metal plugs, wherein bottom surfaces of the source/drain contacts are above the level of the top surfaces of the gate cap and the gate sidewall spacer and wherein at least one source/drain contact extends over the gate sidewall spacer such that a bottom surface of the at least one source/drain contact is physically separated from the gate sidewall spacer by a portion of the interlayer dielectric layer.

9. The structure of claim 8, wherein the metal plugs comprise cobalt plugs.

10. The structure of claim 8, wherein each source/drain contact is immediately adjacent to a top surface and a side surface of an upper end of a metal plug.

11. The structure of claim 8, wherein the top surfaces of the metal plugs are a first distance above the level of the top surfaces of the gate cap and the gate sidewall spacer and wherein the bottom surfaces of the source/drain contacts are a second distance that is less than the first distance above the level of the top surfaces of the gate cap and the gate sidewall spacer.

12. The structure of claim 8, wherein the gate cap and the gate sidewall spacer comprise a first dielectric material and wherein the interlayer dielectric layer comprises a second dielectric material that is different from the first dielectric material.

13. The structure of claim 8, wherein the gate cap and the gate sidewall spacer comprise silicon nitride, silicon oxynitride or a low-K dielectric material, and wherein the interlayer dielectric layer comprises silicon dioxide.

14. The structure of claim 8, wherein the gate sidewall spacer comprises a single layer of spacer material and wherein each metal plug fills a space between the gate sidewall spacer and an additional gate sidewall spacer of an additional transistor that shares a source/drain region with the transistor.

15. A structure comprising:
a transistor comprising: source/drain regions; a channel region positioned laterally between the source/drain regions; a gate adjacent to the channel region; a gate cap on a top surface of the gate; and a gate sidewall spacer positioned laterally adjacent to the gate, wherein top surfaces of the gate cap and the gate sidewall spacer are substantially co-planar;
metal plugs on the source/drain regions, wherein the metal plugs are positioned laterally immediately adjacent to the gate sidewall spacer and wherein top surfaces of the metal plugs are a first distance above a level of the top surfaces of the gate cap and the gate sidewall spacer;
an interlayer dielectric layer immediately adjacent to the top surfaces of the gate cap and the gate sidewall spacer and further extending over upper ends of the metal plugs such that the interlayer dielectric layer is immediately adjacent to a top surface and side surfaces of each metal plug; and
source/drain contacts extending into the interlayer dielectric layer and contacting the metal plugs, wherein bottom surfaces of the source/drain contacts are a second distance above the level of the top surfaces of the gate cap and the gate sidewall spacer, wherein the second distance is less than the first distance, and wherein at least one source/drain contact extends over the gate sidewall spacer such that a bottom surface of the at least one source/drain contact is physically separated from the gate sidewall spacer by a portion of the interlayer dielectric layer.

16. The structure of claim 15, wherein the metal plugs comprise cobalt plugs.

17. The structure of claim 15, wherein each source/drain contact is immediately adjacent to a top surface and a side surface of an upper end of a metal plug.

18. The structure of claim 15,
wherein the gate cap and the gate sidewall spacer comprise a first dielectric material,
wherein the interlayer dielectric layer comprises a second dielectric material that is different from the first dielectric material, and
wherein the gate cap and the gate sidewall spacer comprise silicon nitride, silicon oxynitride or a low-K dielectric material, and wherein the interlayer dielectric layer comprises silicon dioxide.

19. The structure of claim 15, wherein the gate sidewall spacer comprises a single layer of spacer material and wherein each metal plug fills a space between the gate sidewall spacer and an additional gate sidewall spacer of an additional transistor that shares a source/drain region with the transistor.

\* \* \* \* \*